(12) United States Patent
Yu (10) Patent No.: US 6,737,682 B1
(45) Date of Patent: May 18, 2004

(54) HIGH VOLTAGE TOLERANT AND LOW VOLTAGE TRIGGERING FLOATING-WELL SILICON CONTROLLED RECTIFIER ON SILICON-ON-INSULATOR FOR INPUT OR OUTPUT

(75) Inventor: Ta-Lee Yu, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/209,150

(22) Filed: Jul. 30, 2002

(51) Int. Cl.[7] ............................................. H01L 29/74
(52) U.S. Cl. ...................... 257/173; 257/347; 257/350; 257/355; 361/58; 361/91; 438/135
(58) Field of Search ................................ 257/173, 347, 257/350, 355, 546; 361/58, 91; 438/135, 140, 199

(56) References Cited

U.S. PATENT DOCUMENTS

| | | | |
|---|---|---|---|
| 5,012,317 A | 4/1991 | Rountre ........................ 357/38 |
| 5,465,189 A * | 11/1995 | Polgreen et al. .............. 361/58 |
| 5,530,612 A | 6/1996 | Maloney ....................... 361/56 |
| 5,629,544 A | 5/1997 | Voldman et al. ............. 257/355 |
| 6,016,002 A * | 1/2000 | Chen et al. .................. 257/546 |
| 6,465,283 B1 * | 10/2002 | Chang et al. ................ 438/135 |
| 6,465,848 B2 * | 10/2002 | Ker et al. .................... 257/355 |
| 6,573,566 B2 * | 6/2003 | Ker et al. .................... 257/355 |

* cited by examiner

*Primary Examiner*—David Nelms
*Assistant Examiner*—Dao H. Nguyen
(74) *Attorney, Agent, or Firm*—George O. Saile; Stephen B. Ackerman; Douglas R. Schnabel (57) ABSTRACT

A new method to form a LVT-SCR device in the manufacture of an integrated circuit device is achieved. The method comprises providing a SOI substrate comprising a silicon layer overlying a buried oxide layer. The silicon layer further comprises a first well of a first type and a second well of a second type. First and second doped regions of the first type are formed. The first doped region is in the first well. The second doped region is in the second well and forms an anode. Third, fourth, and fifth doped regions of the second type are formed. The third and fourth doped regions are in the first well. The fifth doped region is partly in the first well and partly in the second well. The first and third doped regions form a cathode. First and second gates are formed overlying the silicon layer. The first gate is between the third and fourth doped regions. The second gate is between the fourth and fifth doped regions. The doped regions are not separated by isolation oxide.

20 Claims, 6 Drawing Sheets

HIGH VOLTAGE TOLERANT AND LOW VOLTAGE TRIGGERING FLOATING-WELL SILICON CONTROLLED RECTIFIER ON SILICON-ON-INSULATOR FOR INPUT OR OUTPUT

BACKGROUND OF THE INVENTION (1) Field of the Invention

The invention relates to silicon-on-insulator (SOI) devices and, more particularly, to a method to form a low voltage triggering, silicon-controlled rectifier (SCR) SOI device having improved ESD performance.

(2) Description of the Prior Art

At present, the vast majority of integrated circuit products are formed on bulk semiconductor wafers. However, silicon-on-insulator (SOI) wafer-based products are under development as a majority technology for the future. SOI offers the advantages of improved short channel performance, improved isolation, and reduced power supply capability. However, ESD protection of SOI devices remains a significant challenge to manufacturers. One particular category of ESD devices is the silicon-controlled rectifier (SCR). The SCR is commonly used for ESD protection in bulk semiconductor technology. The present invention relates to SCR development in SOI technology.

Figure 1:
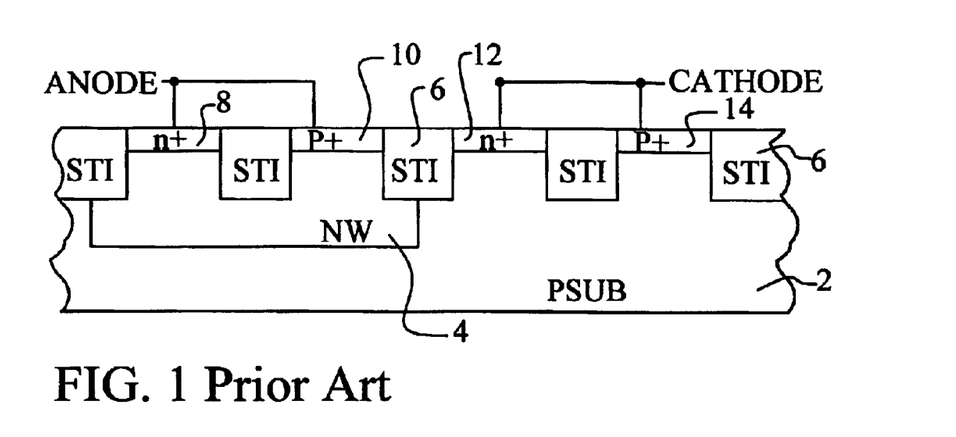
FIG. 1 illustrates a prior art SCR on a bulk semiconductor substrate.

Referring now to FIG. 1, an example of a prior art SCR device in a bulk semiconductor process is shown. The substrate 2 herein comprises p-type silicon. An n-well region 4 is formed in the substrate 2. Shallow trench isolation regions (STI) 6 are formed in the substrate 2 to define areas for active devices, sometimes called the OD area. Heavily doped regions 8, 10, 12, and 14 are formed in the n-well 4 and p-substrate 2. More particularly, a first n+ region 8 and a first p+ region 10 are formed in the n-well 4, and a second n+ region 12 and a p+ region 14 are formed in the substrate 2. The first n+ and p+ regions 8 and 10 are coupled together to form an ANODE. The second n+ and p+ regions 12 and 14 coupled together to form the CATHODE. This structure forms two bipolar devices, a npn transistor and a pnp transistor, which will conduct current from the anode to the cathode during an ESD event.

Figure 2:
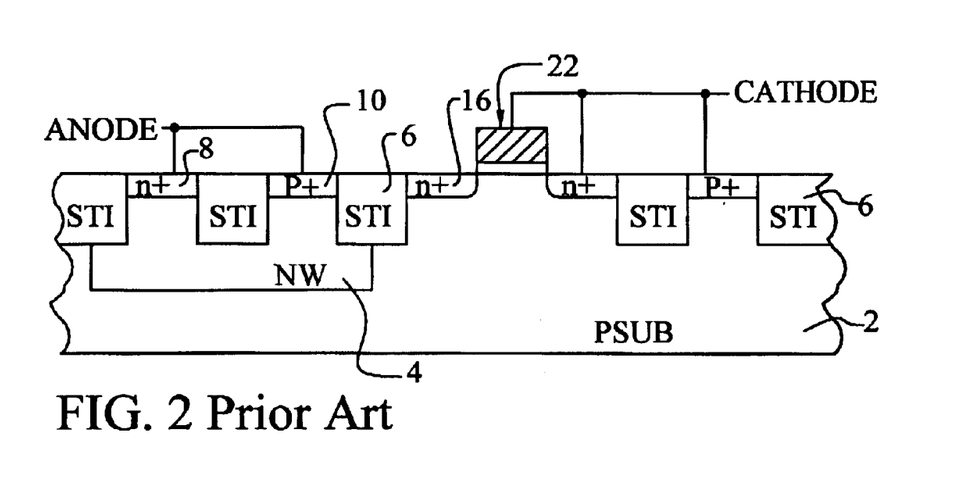
FIG. 2 illustrates a prior art LVT-SCR on a bulk semiconductor substrate.

Referring now to FIG. 2, a second prior art, bulk semiconductor device is shown. Here, a low voltage trigger, SCR, or LVT-SCR, is shown. The LVT-SCR comprises the same n-well 4 and p-substrate 2 combination used by the SCR of FIG. 1. The first n+ region 8, first p+ region 10, second n+ region 18, and second p+ region 20 are placed in the n-well 4 and the p-substrate 2 as in the SCR. However, an additional n+ region 16 is added at the interface of the n-well 4 and the p-substrate 2. Further, a MOS gate 22 is added between the second n+ 18 and the third n+ 16. This gate is coupled to the cathode. This LVT-SCR configuration adds an NMOS device to the npn and pnp devices of the SCR. The NMOS device reduces the triggering voltage of the SCR device and thereby improves the ESD protection capability.

The SCR and LVT-SCR devices of the prior present several difficulties in integration with a SOI process. In an SOI process, the devices must be formed in a relatively thin silicon layer overlying a buried insulator layer. This buried insulator layer, in turn, overlies the bulk substrate. The presence of the buried insulator layer improves MOS transistor performance, especially for very short channel devices, and reduces substrate coupling issues by providing excellent device-to-device isolation. Typically, the STI regions are formed down to the buried insulator layer such that each active area is completely isolated from other active areas.

However, these characteristics cause several problems for SCR devices formed in an SOI process having STI isolation. First, the presence of the STI regions within the SCR and LVT-SCR devices reduces the lateral heat transfer property during an ESD event. Consequently, the devices fail at a lower energy dissipation level. Second, the STI pull-down impacts both low-current and high-current characteristics and influences the diode leakage characteristics. Third, the thickness of the silicon layer overlying the buried insulator can restrict the formation of the SCR device. If the silicon layer is relatively thin, then the heavily doped (n+ and p+) regions will extend down to the buried insulator layer. In this case, the traditional SCR and LVT-SCR design will not work because the bipolar devices will not function.

Several prior art inventions relate to the ESD performance of SOI devices. U.S. Pat. No. 5,012,317 to Rountre shows a conventional SCR. The STI is found to degrade the SCR-ESD protection by reducing gains of parasitic bipolar devices and by reducing lateral heat transfer. U.S. Pat. No. 5,530,612 to Maloney shows an ESD circuit using biased and terminated PNP transistor chains. U.S. Pat. No. 5,629,544 to Voldman et al reveals a diode device for ESD having silicide film and trench isolation. U.S. Pat. No. 5,465,189 to Polgreen et al shows a low voltage triggering SCR. This device is formed in a bulk substrate.

SUMMARY OF THE INVENTION

A principal object of the present invention is to provide an effective and very manufacturable method of forming a LVT-SCR ESD device on a SOI substrate.

A further object of the present invention is to provide a method to form a LVT-SCR device on SOI where the effect of the STI region is reduced.

Another further object of the present invention is to provide a method to form a floating-well, LVT-SCR device on SOI having improved performance.

Another further object of the present invention is to provide an improved LVT-SCR device on SOI having a trigger comprising a stack of MOS transistors.

Another yet further object of the present invention is to improve high voltage tolerance of a LVT-SCR device on SOI by stacking MOS transistors in the triggering section.

In accordance with the objects of this invention, a method to form a LVT-SCR device in the manufacture of an integrated circuit device is achieved. The method comprises providing a SOI substrate comprising a silicon layer overlying a buried oxide layer. The silicon layer further comprises a first well of a first type and a second well of a second type. First and second doped regions of the first type are formed. The first doped region is in the first well. The second doped region is in the second well and forms an anode. Third, fourth, and fifth doped regions of the second type are formed. The third and fourth doped regions are in the first well. The fifth doped region is partly in the first well and partly in the second well. The first and third doped regions form a cathode. First and second gates are formed overlying the silicon layer. The first gate is between the third and fourth doped regions. The second gate is between the fourth and fifth doped regions. The doped regions are not separated by isolation oxide.

Also in accordance with the objects of this invention, a LVT-SCR device on a SOI substrate is achieved. The device comprises a SOI substrate comprising a silicon layer overlying a buried oxide layer. The silicon layer further comprises a first well of a first type and a second well of a second type. First and second doped regions comprise the first type. The first doped region is in the first well. The second doped region is in the second well and forms an anode. Third, fourth, and fifth doped regions comprise the second type. The third and fourth doped regions are in the first well. The fifth doped region is partly in the first well and partly in the second well. The first and third doped regions form a cathode. First and second gates overlie the silicon layer. The first gate is between the third and fourth doped regions. The second gate is between the fourth and fifth doped regions. The doped regions are not separated by isolation oxide.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to form a LVT-SCR device on SOI with shallow trench isolation and having improved ESD performance. Further, the LVT-SCR device comprises novel, stacked MOS transistors to create a triggering mechanism having higher voltage tolerance. It should be clear to those experienced in the art that the present invention can be applied and extended without deviating from the scope of the present invention.

Figure 3:
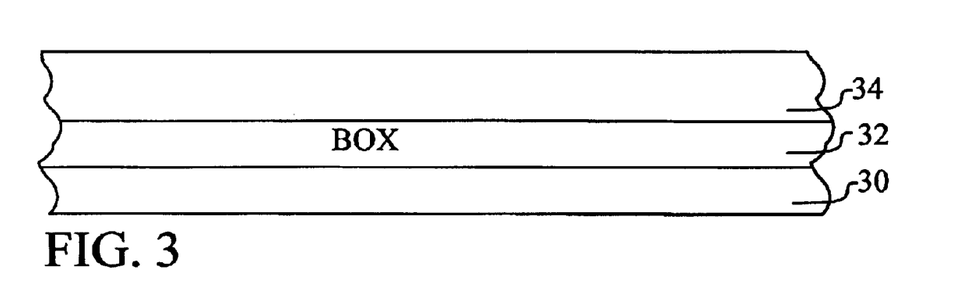
FIGS. 3 through 9 illustrate a preferred embodiment method of forming a LVT-SCR device on SOI of the present invention.

Referring now to FIG. 3, the preferred starting point of the method of the present invention is shown. The present invention applies to any SOI system. In this case, the SOI system, shown in cross-sectional representation, comprises a buried oxide layer 32 overlying a substrate 30. For example, the substrate 30 may comprise silicon. The buried oxide layer 32 preferably comprises a thick silicon oxide layer that is either grown or deposited overlying the silicon substrate 30. Other oxide materials could be used for the buried oxide layer 32.

A silicon layer 34 is formed overlying the buried oxide layer 32. The silicon layer 34 preferably comprises a monocrystalline layer that is formed using, for example, an epitaxial deposition. The silicon layer 34 may be formed to a range of thickness as will be discussed below. The stack comprising silicon layer 34, buried oxide layer 32, and substrate 30 forms the silicon-on-insulator (SOI) system for this embodiment. Alternatively, the substrate 30 could be absent from the system wherein the substrate would comprise merely a buried oxide layer 30. For simplicity, the substrate 30 will not be depicted in the Figures that follow FIG. 3.

Figure 4:
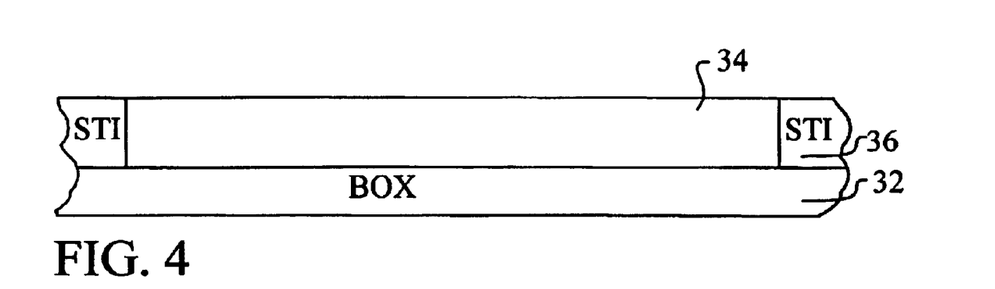

Referring now to FIG. 4, shallow trench isolations (STI) 36 are formed in the silicon layer 60 using methods well known in the art. These STI regions 36 define active area regions of silicon layer 34 where active devices may be subsequently formed. Of particular importance to the present invention is the fact that the STI regions 36 are not formed within the area of the planned SCR device as in the prior art.

Figure 5:
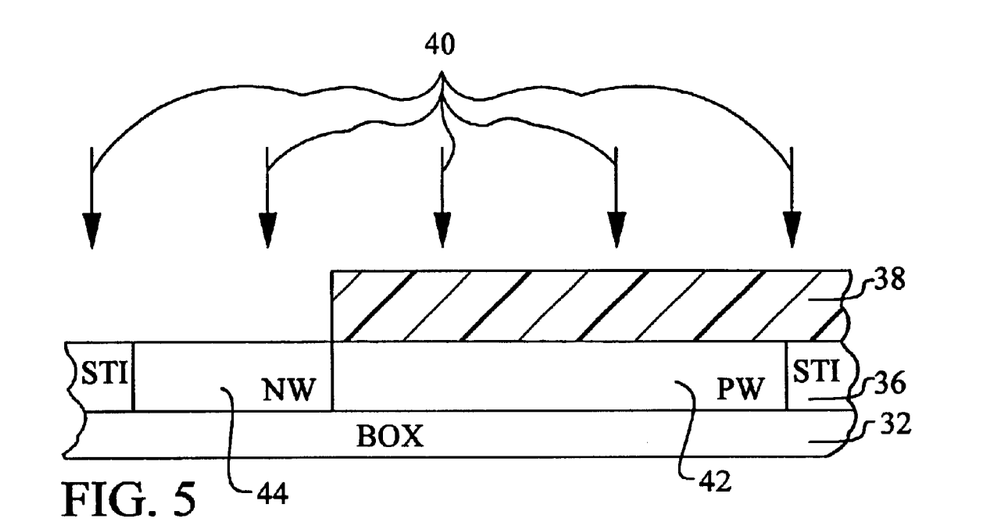

Referring now to FIG. 5, a first well 42 of a first type is formed, and a second well 44 of a second type is formed. In the preferred embodiment, the first well 42 is p-type and is therefore called the p-well. The second well 44 is n-type and is called the n-well. The first and second wells 42 and 44 may be formed by ion implantation 40 of the silicon layer using a masking layer 38 to cause the implantation to be selective. Alternatively, either the p-well or the n-well may simply comprise the silicon layer 34 formed with an insitu doping. In this case, only a single ion implantation needs to be performed to counter-dope the silicon layer 34 to the other type. For example, the silicon layer 34 may be formed as a p-type region, and the n-well 44 region is then formed by ion implantation 40 as is well known in the art. Finally, the well regions 42 and 44 may be doped using a diffusion process.

Figure 6:
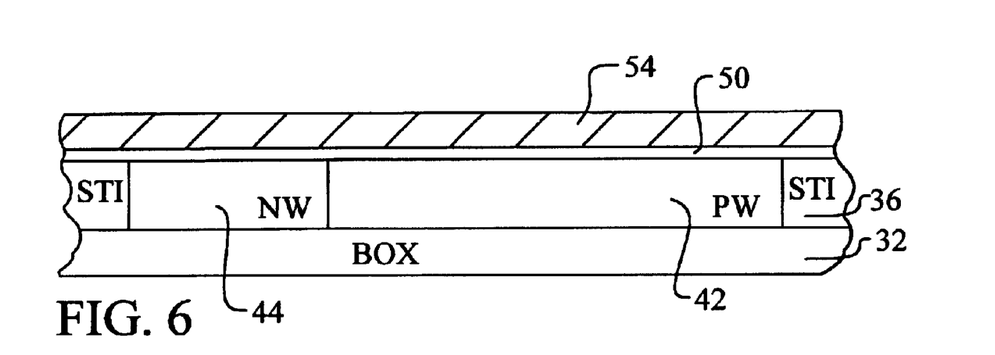

Referring now to FIG. 6, as an important feature of the present invention, a preliminary step to the formation of gates for the LVT-SCR device is performed. First, a gate oxide layer 50 is formed overlying the silicon layer 42 and 44. The gate oxide layer 50 preferably comprises silicon dioxide that is formed by thermal oxidation or by chemical vapor deposition (CVD). More preferably, the gate oxide layer 50 comprises the same gate oxide layer used for forming a plurality of MOS devices on the remainder of the integrated circuit device.

A polysilicon layer 54 is deposited overlying the gate oxide layer 50. More preferably, the polysilicon layer 54 comprises the same layer used in the formation of a plurality of MOS devices on the remainder of the integrated circuit device.

Figure 7:
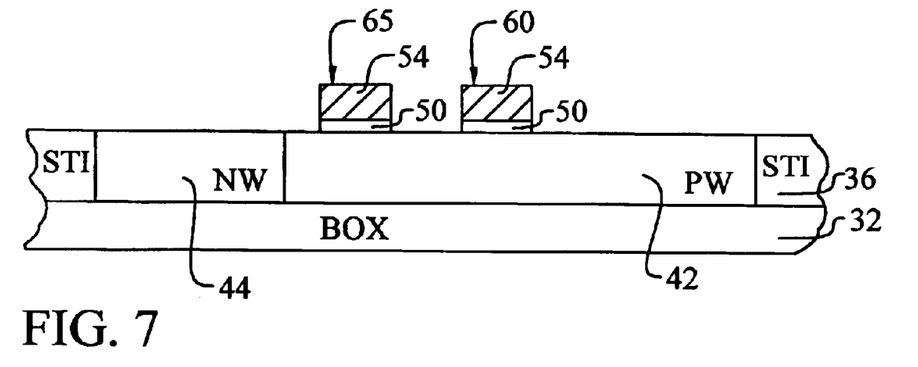

Referring now to FIG. 7, another important feature of the present invention is shown. The polysilicon layer 54 is patterned to form MOS gates 60 and 65. More particularly, a first gate 60 and a second gate 65 are formed overlying the first well 42. The polysilicon layer 54 is preferably patterned using a photolithographic process wherein a photosensitive resist material, not shown, is deposited and then exposed to actinic light through a mask. After development, the remaining photoresist is used to define where an etching process will remove the polysilicon layer 54. Finally, after etching, the photoresist layer is removed.

Figure 8:
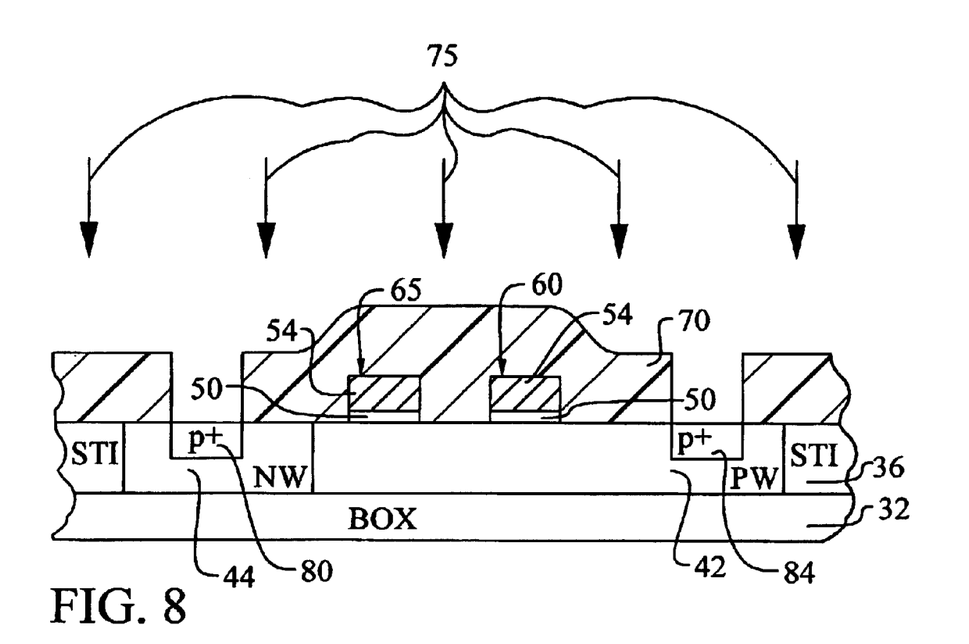

Referring now to FIG. 8, as an important feature of the present invention, first and second doped regions 84 and 80 of the first type are formed in the wells 42 and 44. More particularly, a first doped region 84 of the first type is formed in the first well 42. A second doped region 80 is formed in the second well 44. In the preferred embodiment, the first doped region 50 comprises a P+ type region formed in the p-well 42 and the second doped region comprises a P+ type region formed in the n-well 44. Preferably, the first and second doped regions 84 and 80 are formed using an ion implantation 75. A masking layer 70 may be used to cause the implantation 75 to be selective.

Figure 9:
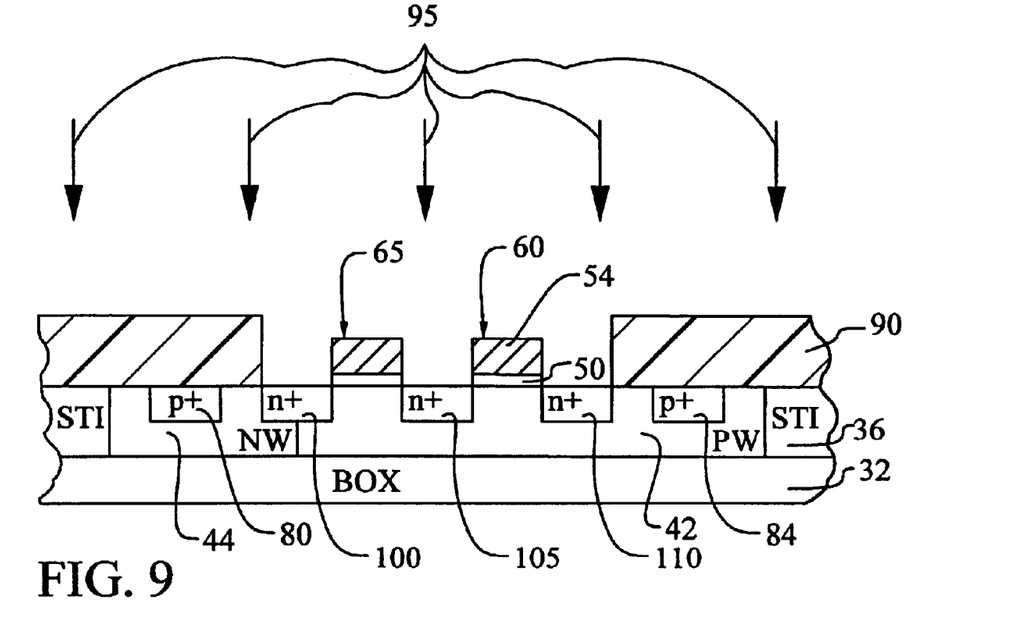

Referring now to FIG. 9, another important feature of the present invention is illustrated. Third, fourth, and fifth doped regions 110, 105, and 100, of the second type are formed in the silicon layer 42 and 44. More particularly, third and fourth doped regions 110 and 105 are formed in the first well 42. The fifth doped region 100 is formed partly in the first well 42 and partly in the second well 44. Most preferably, the second, third, and fourth regions 110, 105, and 100, comprise N+ type regions. Preferably, ions are selectively implanted 95 through a masking layer 90 to form the third, fourth, and fifth doped regions. Note that the first and second gates 60 and 65 mask the ion implantation such that self-aligned MOS transistors 60 and 65 are formed. In addition, note that the STI regions 36 do not extend into the LVT-SCR device nor do they separate the first or second type doped regions.

Figure 10:
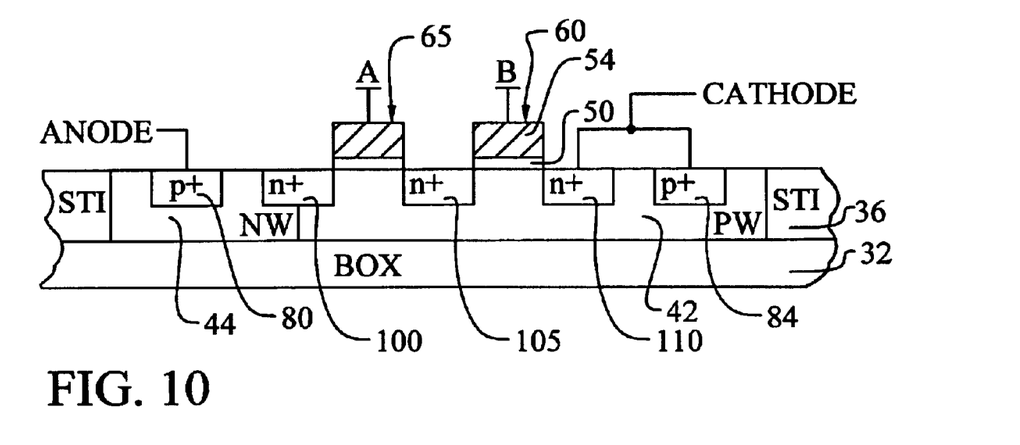
FIG. 10 illustrates a first preferred embodiment LVT-SCR device on SOI of the present invention in cross-section where the N+ and P+ regions partially deplete the wells.

Referring now to FIG. 10, the completed first preferred embodiment LVT-SCR device on SOI of the present invention is illustrated in cross-section. As will be discussed below, the first embodiment version comprises N+ and P+ regions 80, 84, 100, 105, and 110, that partially deplete the wells 42 and 44. Several important features of the present invention device are illustrated. The novel, LVT-SCR on SOI device comprises a SOI substrate comprising a silicon layer 42 and 44 overlying a buried oxide layer 32. The silicon layer further comprises a first well 42 of a first type and a second well 44 of a second type. First and second doped regions 84 and 80 comprise the first type. The first doped region 84 is in the first well 42. The second doped region 80 is in the second well 44 and forms an anode. Third, fourth, and fifth doped regions 110, 105, and 100, comprise the second type. The third and fourth doped regions 110 and 105 are in the first well 42. The fifth doped region 100 is partly in the first well 42 and partly in the second well 44. The first and third doped regions 84 and 110 form a cathode. First and second gates 60 and 65 overlie the silicon layer. The first gate 60 is between the third and fourth doped regions 110 and 105. The second gate 65 is between the fourth and fifth doped regions 105 and 100. The doped regions are not separated by isolation oxide.

Two MOS transistors are formed by the gates 60 and 65. In particular, a first NMOS transistor is formed by first gate 60, third doped region 110, and fourth doped region 105. A second MOS transistor is formed by second gate 65, fourth doped region 105, and fifth doped region 100. The first and second transistors are in series between the third doped region 110 and the fifth doped region 100. Further, the fifth doped region 100 is coupled to the second well 44, and the third doped region is coupled to the first doped region to form the cathode. Therefore, the first and second NMOS transistors are cascaded, or stacked, between the cathode terminal and the second well 44. Finally, the first gate 60 is coupled to the voltage B while the second gate is coupled to the voltage A.

Figure 11:
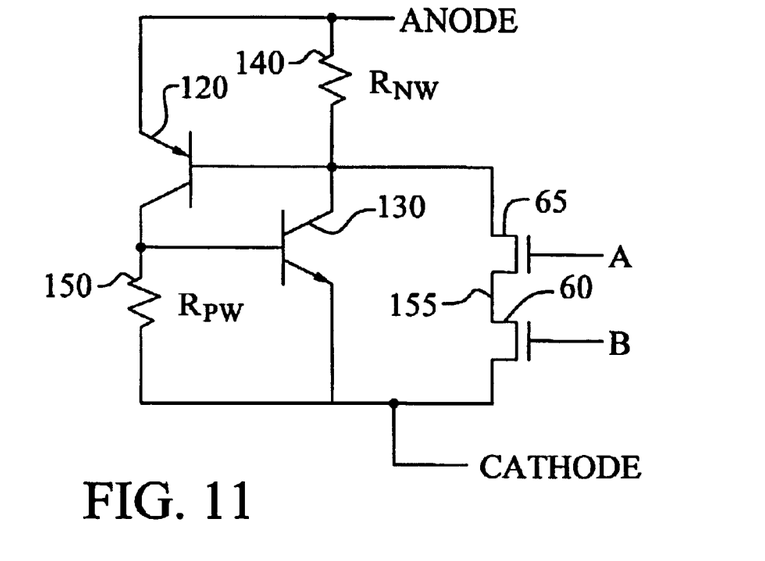
FIG. 11 illustrates a model of the LVT-SCR device of the present invention.

Referring now to FIG. 11, a model of the novel LVT-SCR device of the present invention is shown. Several important features of the present invention are illustrated. The model comprises two bipolar devices. A pnp transistor 120 is formed from the second doped region (P+) 80, the second well (n-well). 44, and the first well (p-well) 42. A npn transistor 130 is formed from the fifth doped region (N+) 100, the first well (p-well) 42, and the third doped region (N+) 110. An n-well resistor $R_{NW}$ 140 and a p-well resistor $R_{PW}$ 150 are formed by the respective wells. Most importantly, the stacked NMOS transistors 65 and 60 are formed from the pnp base/npn collector to the cathode terminal.

The novel, LVT-SCR device provides a low triggering voltage level. This is because the NMOS stack will turn ON at a relatively low anode-to-cathode voltage. However, as a distinct advantage, the turn-ON voltage is a voltage threshold above the voltage A on the second gate 65. Further, since the two NMOS transistors are stacked, neither device must sustain the entire anode-to-cathode voltage during the OFF state.

In particular, the LVT-SCR device can be used in one of two ways. First, if the device is used to protect an input pin, then the voltage B on the first gate 60 is biased to ground. The voltage A on the second gate 65 is biased to the positive supply voltage of, for example, about 3.3 Volts. The anode is tied to the input pad, and that the cathode is tied to ground. Assuming that the anode is driven externally to about 5.0 Volts, then the center diffusion between the first and second NMOS transistors will be about 2.8 Volts. In this condition, the NMOS stack is OFF and, yet, neither of the NMOS transistors is required to sustain any voltage exceeding the 3.3 Volt level. Therefore, the operating mode is within a range for excellent, gate oxide injection (GOI) and hot carrier injection (HCI) reliability.

Second, the LVT-SCR device may be used as an output protection device. The anode is again coupled to the pad, while the cathode is coupled to ground. The voltage A of the second gate 65 is again coupled to the power supply level of about 3.3 Volts. In this case, however, the voltage B of the first gate 60 is coupled to the control signal of the output. That is, assuming that the anode is further coupled to an output driver on the same integrated circuit, then the B signal is coupled to the control signal of that output driver, such as an inverter buffer. Again, this configuration insures that the neither of the stacked NMOS devices 60 and 65 sustains a voltage above the internal supply of about 3.3 Volts.

During an ESD event, the stack NMOS devices 60 and 65 operate due to the bipolar effect taking place between the source of the bottom NMOS device 60 and the drain of the top NMOS device 65. The SCR 120, 130, 140, and 150, is triggered by the current generated when the stacked NMOS devices 60 and 65 enter avalanche breakdown.

Referring again to FIG. 10, another important feature of the present invention is shown. The doped regions 80, 84, 100, 105, and 110, are formed in the upper part of the wells 42 and 44 and do not extend to the buried oxide layer 32. That is, the original silicon layer in which the doped regions are formed is thick enough so that the doped regions do not completely deplete the wells 42 and 44. This version of the LVT-SCR device of the present invention is said to be a partially depleted device.

Figure 12:
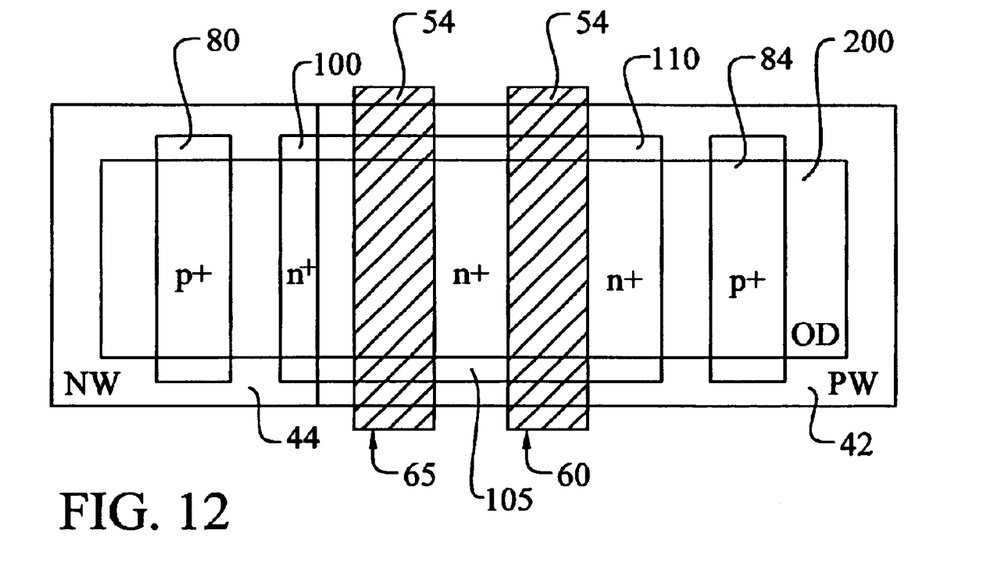
FIG. 12 illustrates the first preferred embodiment LVT-SCR device in top layout view for the partially depleted case.

Referring now to FIG. 12, a top layout view of the partially depleted embodiment of the LVT-SCR device of the present invention is shown. An OD region 200 is defined. The OD region 200 represents the active device area. The shallow trench isolation (STI) regions are formed in the area outside of the OD box 200. The first well (PW) 42 and the second well (NW) 44 are defined as overlapping the OD 200 boundaries to insure that entire OD region 200 is formed as either PW or NW. Polysilicon lines 54 are defined for the first gate 60 and the second gate 65 as is typical in the art. The first doped region layer (P+) 80 is defined as overlapping the edges of the OD layer 200. Likewise, the second doped region layer (N+) 84 overlaps the edges of the OD layer 200. The N+ layer 84 is spaced from the P+ layer 80. Note that P+ 80 and N+ 84 layers may overlap the edges of the OD layer 200 because the device process is partially depleted as shown in FIG. 10.

Figure 13:
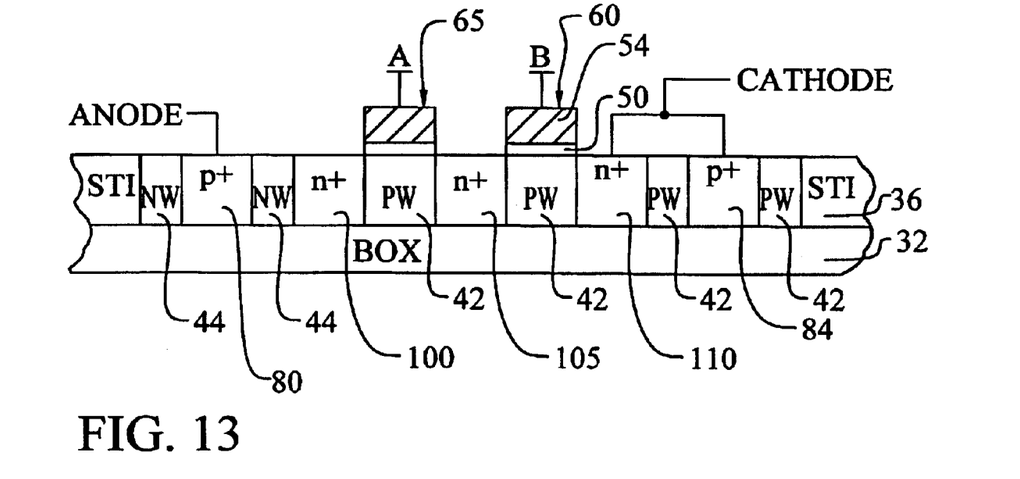
FIG. 13 illustrates a second preferred embodiment LVT-SCR device in cross section showing the fully depleted case.
Figure 14:
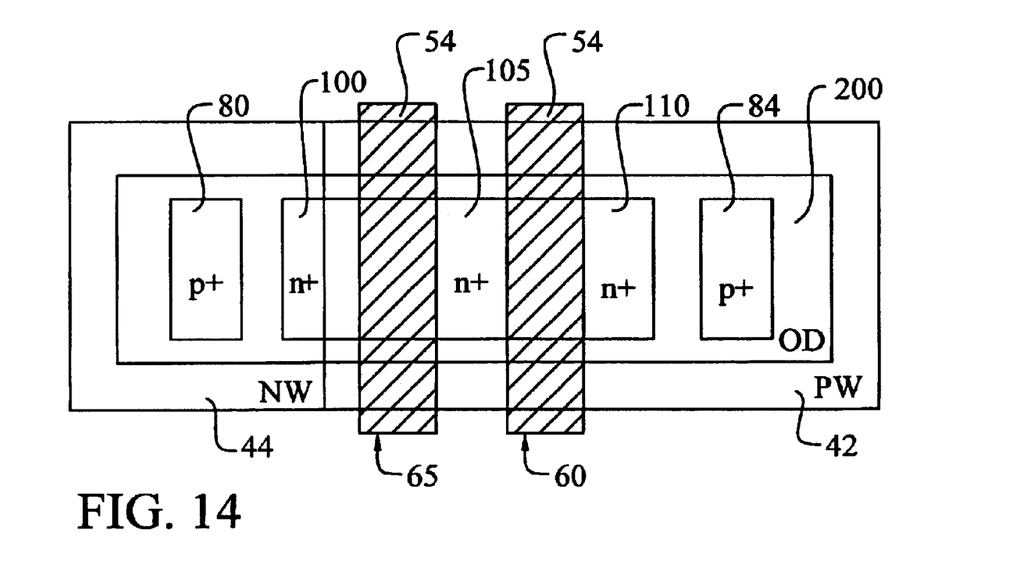
FIG. 14 illustrates the second preferred embodiment LVT-SCR device in top layout view for the fully depleted case.

Referring now to FIG. 13, a second preferred embodiment of the present invention is shown. In this embodiment, the silicon layer 42 and 44 is not formed to a sufficient thickness to prevent complete depletion of the wells 42 and 44 by the doped regions 80, 84, 100, 105, and 110. Therefore, to ensure that the bipolar devices of the SCR work, the layout must be modified. Referring now to FIG. 14, the second preferred embodiment of the top view layout of the present invention is shown. In this layout, the first doped region (P+) 80 and the second doped region (N+) 84 must be made smaller than the OD region 200. The OD region 200 must have an overlap so that the bipolar action of the SCR devices can take place on the perimeter instead of in the bulk.

The advantages of the present invention may now be summarized. An effective and very manufacturable method of forming a LVT-SCR ESD device on a SOI substrate is achieved. The effect of the STI region is reduced. The method forms a floating-well, LVT-SCR device on SOI having improved performance. An improved LVT-SCR device on SOI having a trigger comprising a stack of MOS transistors is achieved. The high voltage tolerance of a LVT-SCR device on SOI is improved by stacking MOS transistors in the triggering section.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form a LVT-SCR device in the manufacture of an integrated circuit device comprising:
   providing a SOI substrate comprising a silicon layer overlying a buried oxide layer wherein said silicon layer further comprises a first well of a first type and a second well of a second type;
   forming first and second gates overlying said first well;
   forming first and second doped regions of said first type wherein said first doped region is in said first well and wherein said second doped region is in said second well and form an anode; and
   forming third, fourth, and fifth doped regions of said second type wherein said third and fourth doped regions are in said first well, wherein said fifth doped region is partly in said first well and partly in said second well, wherein said first and third doped regions form a cathode, wherein said first gate is between said third and fourth doped regions, wherein said second gate is between said fourth and fifth doped regions, and wherein said doped regions are not separated by isolation oxide.

2. The method according to claim 1 wherein said doped regions fully deplete said wells.

3. The method according to claim 1 wherein said doped regions partially deplete said wells.

4. The method according to claim 1 wherein said steps of forming said first and second regions and of forming said third, fourth, and fifth regions comprise ion implantation.

5. The method according to claim 1 wherein said step of forming said first and second gates comprises:

depositing a gate oxide layer overlying said silicon layer;
depositing a polysilicon layer overlying said gate oxide layer; and
patterning said polysilicon layer to form said first and second gates.

6. The method according to claim 1 wherein said anode is coupled to an output pad, said cathode is coupled to a ground reference, said first gate is coupled to a control signal, and said second gate is coupled to a supply voltage.

7. The method according to claim 1 wherein said anode is coupled to an input pad, said cathode is coupled to a ground reference, said first gate is coupled to said ground reference, and said second gate is coupled to a supply voltage.

8. The method according to claim 1 wherein said first and second doped regions comprise P+, said third, fourth, and fifth doped regions comprise N+, said first well comprises P-well, and said second well comprises N-well.

9. A LVT-SCR device on a SOI substrate, said device comprising:
   a SOI substrate comprising a silicon layer overlying a buried oxide layer wherein said silicon layer further comprises a first well of a first type and a second well of a second type;
   first and second doped regions of said first type wherein said first doped region is in said first well and wherein said second doped region is in said second well and forms an anode;
   third, fourth, and fifth doped regions of said second type wherein said third and fourth doped regions are in said first well, wherein said fifth doped region is partly in said first well and partly in said second well, and wherein said first and third doped regions form a cathode; and
   first and second gates overlying said silicon layer wherein said first gate is between said third and fourth doped regions, wherein said second gate is between said fourth and fifth doped regions, and wherein said doped regions are not separated by isolation oxide.

10. The device according to claim 9 wherein said doped regions fully deplete said wells.

11. The device according to claim 9 wherein said doped regions partially deplete said wells.

12. The device according to claim 9 wherein said gates comprise a polysilicon layer overlying said silicon layer with a gate oxide layer therebetween.

13. The device according to claim 9 wherein said anode is coupled to an output pad, said cathode is coupled to a ground reference, said first gate is coupled to a control signal, and said second gate is coupled to a supply voltage.

14. The device according to claim 9 wherein said anode is coupled to an input pad, said cathode is coupled to a ground reference, said first gate is coupled to said ground reference, and said second gate is coupled to a supply voltage.

15. The device according to claim 9 wherein said first and second doped regions comprise P+, said third, fourth, and fifth doped regions comprise N+, said first well comprises P-well, and said second well comprises N-well.

16. A LVT-SCR device on a SOI substrate, said device comprising:
   a SOI substrate comprising a silicon layer overlying a buried oxide layer wherein said silicon layer further comprises a P-well and a N-well;
   first and second doped regions comprising P+ wherein said first doped region is in said P-well and wherein said second doped region is in said N-well and forms an anode;

third, fourth, and fifth doped regions comprising N+ wherein said third and fourth doped regions are in said P-well, wherein said fifth doped region is partly in said P-well and partly in said N-well, and wherein said first and third doped regions form a cathode; and first and second gates overlying said silicon layer wherein said first gate is between said third and fourth doped regions, wherein said second gate is between said fourth and fifth doped regions, and wherein said doped regions are not separated by isolation oxide.

17. The device according to claim 16 wherein said doped regions fully deplete said wells.

18. The device according to claim 16 wherein said doped regions partially deplete said wells.

19. The device according to claim 16 wherein said anode is coupled to an output pad, said cathode is coupled to a ground reference, said first gate is coupled to a control signal, and said second gate is coupled to a supply voltage.

20. the device according to claim 16 wherein said anode is coupled to an input pad, said cathode is coupled to a ground reference, said first gate is coupled to said ground reference, and said second gate is coupled to a supply voltage.

* * * * *